United States Patent [19]

DeWalch

[11] Patent Number: 4,702,093
[45] Date of Patent: Oct. 27, 1987

[54] LOCKABLE METER CLAMP RING

[76] Inventor: Norman B. DeWalch, 3668 Delmonte Dr., Houston, Tex. 77019

[21] Appl. No.: 1,125

[22] Filed: Jan. 7, 1987

[51] Int. Cl.$^4$ ............... B65D 55/14; G10R 11/04
[52] U.S. Cl. .................... 70/164; 292/256.6
[58] Field of Search ............ 70/19, 158, 163, 164, 70/165, 166, 167, 168, 169, 170, 171, 172, 173; 292/256.6, 256.63, 256.65

[56] References Cited

U.S. PATENT DOCUMENTS

| | | | |
|---|---|---|---|
| 3,867,822 | 2/1975 | Morse et al. | 70/164 |
| 4,008,585 | 2/1977 | Lundberg | 70/164 |
| 4,158,953 | 6/1979 | Nielsen, Jr. | 70/164 |
| 4,329,860 | 5/1982 | Moberg | 70/164 |
| 4,331,012 | 5/1982 | Swisher | 70/164 |
| 4,413,490 | 11/1983 | Nielsen, Jr. | 70/164 |
| 4,415,190 | 11/1983 | Finck, Jr. et al. | 292/256.6 |

Primary Examiner—Robert L. Wolfe
Attorney, Agent, or Firm—Paul L. DeVerter, II

[57] ABSTRACT

A lockable clamp ring for securing an electric meter to a meter housing flange, which incorporates a unitary structure with moveable parts. The ends of the split ring are held within a Y-shaped housing and a similar shaped spreader which are manipulated to hold the ends of the ring closed in a locked position, and open when it is desired to remove the ring.

11 Claims, 21 Drawing Figures

LOCKABLE METER CLAMP RING

BACKGROUND OF THE INVENTION

The present invention relates to an improved clamping ring for use with an electric utility meter, and more particularly for an improved clamp ring which is used to secure the meter to its housing.

This application is a continuation-in-part of my copending application, Ser. No. 786,831 filed Oct. 11, 1985 now abandoned entitled Lock Ring, now abandoned in favor of this application.

Typically the electric meter housing has a circular flange which extends radially outwardly from the housing. The electric meter itself has a somewhat wider circular flange or base which fits against the housing flange. A split U-shaped clamping ring is then placed over both of these flanges to hold the meter to the meter housing, and in turn, some method must be provided for securing the ends of the ring, and to provide a means for locking it over the joint, so that the meter may not be removed and be tampered with. Thus, the object of such a clamp ring is to prevent unauthorized access to the backside of the meter.

Clamp rings of the same general sort are shown in U.S. Pat. Nos. 3,867,822; 4,158,953; 4,413,490; and 4,415,190. The present invention alters the conventional shape of the ends of the clamp ring and provides a unique method to sandwich the ends of the ring together to prevent the clamp ring from being removed from the meter housing when an appropriate lock is in place, and at the same time provides a unique method to open the ends of the ring so that it may be more readily removed from the meter base, so that the meter can be changed, or removed, as desired.

More particularly, the prior devices have been somewhat hard to manipulate, and particularly to spread the ends of the ring far enough apart to get it over the flanges, and to then bring the two ends together so that a housing may be installed to hold the ends in a position to lock the meter to the case, and then thereafter to install a lock and a seal. The present invention is directed toward improvements which overcome these objections.

SUMMARY OF THE INVENTION

The present invention provides a clamp ring for a meter and the meter housing which uses specially shaped arms and lugs formed in the ring ends, in combination with a generally Y-shaped housing and a Y-shaped spreader which serve not only to wedge the ends of the ring apart for insertion over the meter, but also serve to wedge the ends of the ring together to clamp, and thereafter lock, the ring in place. Further, the entire clamp ring is constructed so that it is a unitary piece, with several moving parts, thereby avoiding the tendency to drop or lose parts of multiple part assemblies.

Thus, it is an object of the present invention to provide a clamp ring in a unitary structure which is stable in both the open and the closed positions.

It is the further object of the present invention to provide a clamp ring which is relatively easy to manipulate, and at the same time is tamper resistant.

Other and further objects, features and advantages will be apparent from the following description of the presently preferred embodiments of the invention, given for the purpose of disclosure, when taken in conjunction with the accompanying drawings:

BRIEF DESCRIPTION OF THE DRAWINGS

Like character references designate like parts throughout the several views of the drawings, which are.

DESCRIPTION OF THE PREFERRED EMBODIMENTS

Figures 9, 10, 11, 12, 13:
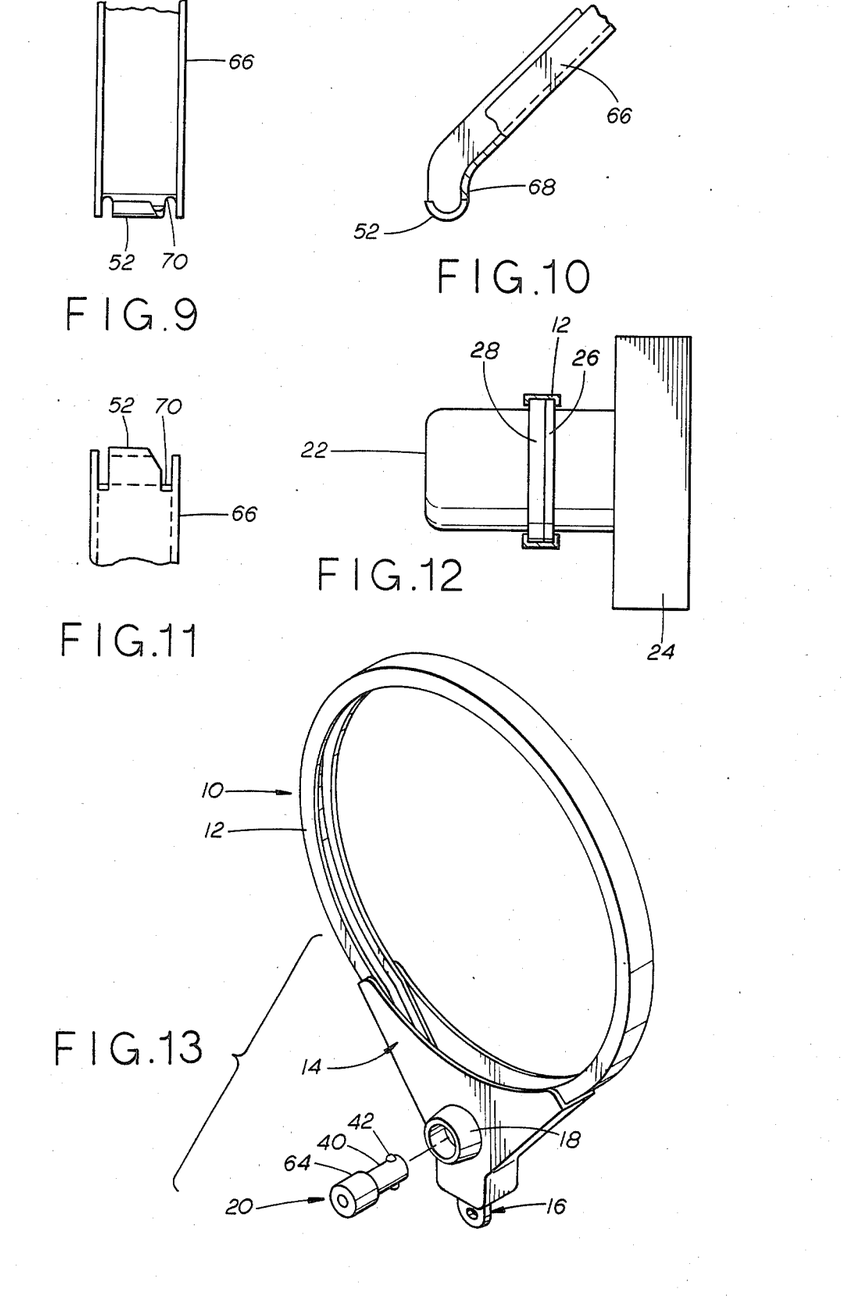
FIG. 9 is a partial side view of the inside of the bottom arm, extension and lug of the ring.
FIG. 10 is a front view, partially in section of the arm shown in FIG. 9.
FIG. 11 is a partial bottom view looking up at the lug shown in FIG. 9.
FIG. 12 is a top view, partially in section, showing an electric meter mounted on a meter box with the clamp ring in place.
FIG. 13 is a perspective view of the clamp ring in closed position ready for insertion of a barrel lock.

Referring now to the drawings, and particularly to FIG. 13, the reference numeral 10 generally refers to the clamp ring of the present invention. The clamp ring 10 includes the split ring 12, which generally has a U-shaped cross section, a housing 14 which holds the ends of the ring, a spreader 16 which fits within the housing and between the ends of the ring 12, an optional lock guard 18, and is used in conjunction with the conventional barrel lock 20. Referring to FIG. 12 where a top view of an electric meter 22 is shown mounted on a meter box 24, the ring 12 is seen surrounding the outwardly facing flange 26 on the meter box 24, as well as the flange or base 28 of the meter 22. The method of holding the meter to the meter box, shown in FIG. 12 is conventional.

Figure 1:
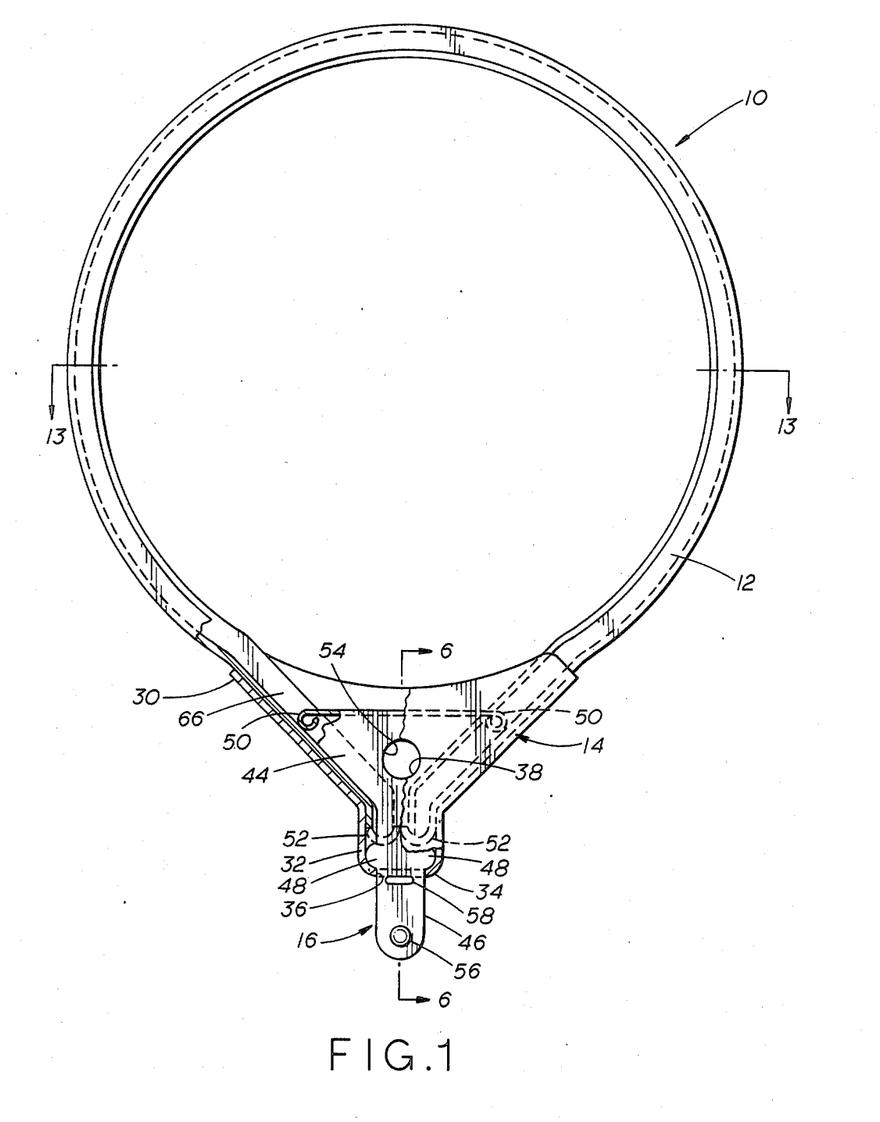
FIG. 1 is front view, partially in section, showing the first embodiment of the invention in the closed position.

Referring now to FIG. 1, the clamp ring 10 is shown in its closed position. If it were installed on a meter base, the entire base would be surrounded by the ring 12 or by the housing 14. Notice that the housing 14 is of a general Y-shape, having a generally large mouth 30 which goes adjacent to the meter and the sides of the housing taper in to a relatively small throat 32 through which the spreader 16 extends. The housing 14 has a closed bottom 34, except for the elongate opening 36 through which the spreader 16 extends. The housing 14 also has a bolt hole 38 therein, which is sized to just accommodate the bolt 40 of the lock 20 when the retaining balls 42 (seen in FIGS. 6 and 13) are not extended.

The spreader 16 is also a generally Y-shaped member, the legs 44 of which conform to the angle of the mouth of the housing. The bottom of the spreader terminates in a stem 46 which extends through the elongated opening 36 of the housing. The stem may include centralizer tabs 48 on either side, which function to keep the stem centered in the throat 32 of the housing, as will be hereinafter explained.

Figure 7:
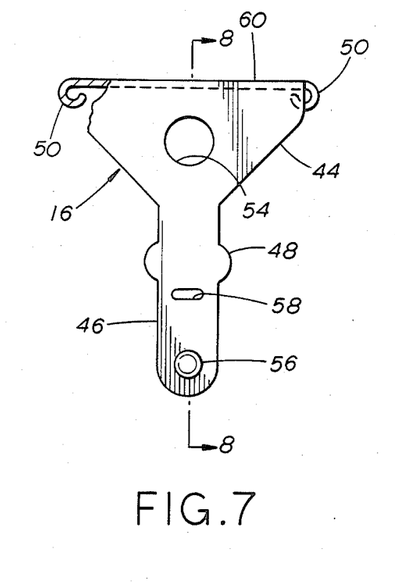
FIG. 7 is a front view, partially in section of the spreader.
Figure 8:
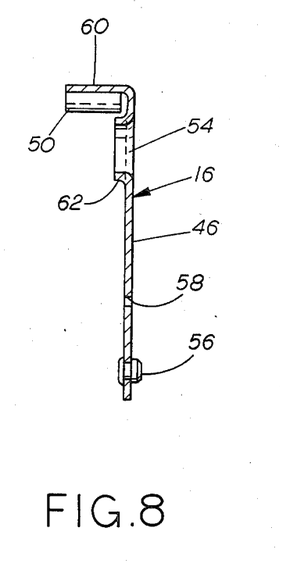
FIG. 8 is a sectional side view taken along the line 8—8 of FIG. 7.

Referring to FIGS. 7 and 8, at the top 60, and on either side of the spreader are shoulders 50 which are designed to catch and engage the inwardly shaped lugs 52 on either end of the ring 12. The spreader 16 also includes a bolt hole 54 which is the same size as the bolt hole 38 in the housing, and is coaxial therewith when the clamp ring is locked. The stem 46 of the spreader includes a stop, here shown as a rivet 56, at the bottom end, which functions to prevent the removal of the spreader from the housing after the rivet is inserted. Extending through the stem 46 of the spreader 16, and just below the bottom 34 of the housing 14 is a slot 58. This slot may be utilized for the insertion of a seal (not shown) in a conventional manner, to indicate whether the clamp ring has been removed or opened.

Figures 5, 6:
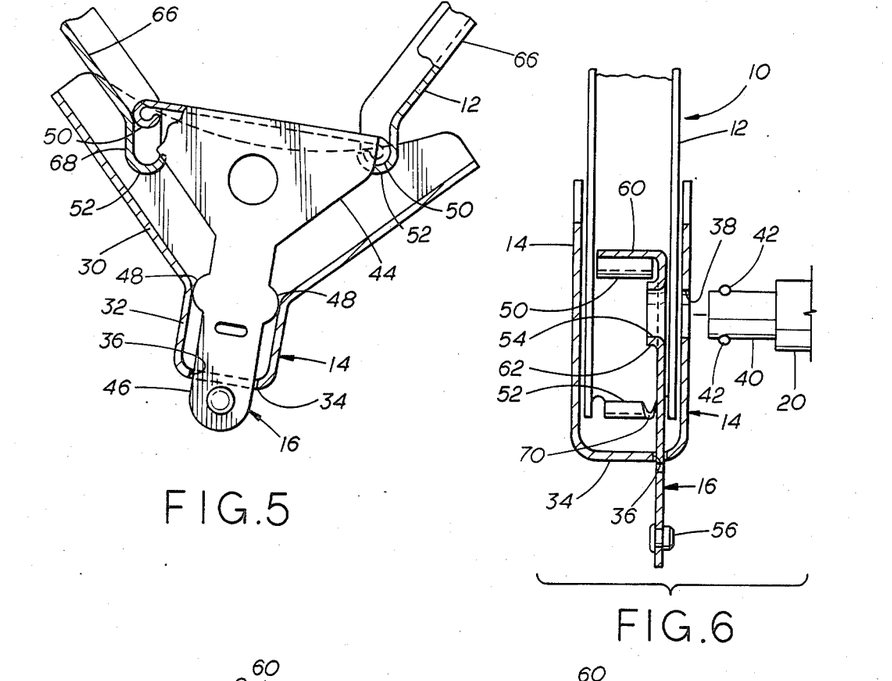
FIG. 5 is a further partial view similar to FIG. 1, showing the housing and spreader canted with respect to the ring in order to permit closing of the ring.
FIG. 6 is a partial sectional view, taken along the line 6—6 of FIG. 1 showing how a barrel lock may be utilized with the clamp ring.

Referring now to FIG. 6, where a side view of the closed clamp ring 10 is shown, the alignment of the bolt hole 38 in the housing 14 with the bolt hole 54 in the spreader 16 is shown. It is also seen how the balls 42, when extended outwardly, prevent the bolt 40 from being inserted into, or removed from the clamp ring 10, simply because of the interference of the balls with the respective bolt holes. This general method of retaining a barrel lock in an opening is conventional. FIG. 6 further illustrates how the rivet 56 prevents the removal of the spreader 16 from the elongated opening 36 of the bottom 34 of the housing 14. The top 60 of the spreader is bent over so as to extend between the legs of the U-shaped ring 12 and the outer ends of the legs 44 of the spreader terminate in the shoulders 50, while the ends of the ring 12 are formed into lugs 52. The spreader 16 hole 54 is upset to form a reinforcement area 62 for the spreader within the housing. This is done to provide additional strength to the spreader hole 54, and may also be accomplished by attaching a ring in the same area. Referring to FIG. 13, an additional form of protection is shown in the lock guard 18. This optional guard may comprise a ring which is welded on or otherwise attached to the housing to surround the key portion 64 of the barrel lock 20, when it is inserted.

Referring again to FIG. 1, it will be noted that the ring 12, while being of U-shaped cross section, is formed to the general shape of a circle so that it will fit snugly over the mounting base of the electric meter 22. The ring is split in half, so that it may be separated enough to slip over the meter base 28 and the meter box flange 26. The open ends of the ring are formed into two arms 66 which are shaped to the same angle as the legs 44 of the spreader and the inside or mouth 30 of the housing. These arms are formed generally as a tangent to the ring 12. Then, the end of each arm is turned into a relatively short extension 68, the outer surface of which is parallel to the throat 32 of the housing, and thus almost radial to the ring. A detail of the end of one of the arms 66 is seen in FIGS. 9–11, and it will be noted that the extension 68 terminates in the inwardly shaped lug 52, previously noted. While the lug 52 generally runs across the width of the ring 12, an opening 70 must be provided so that the spreader 16 can be placed therein, as seen in FIG. 6.

Figures 2, 3, 4:
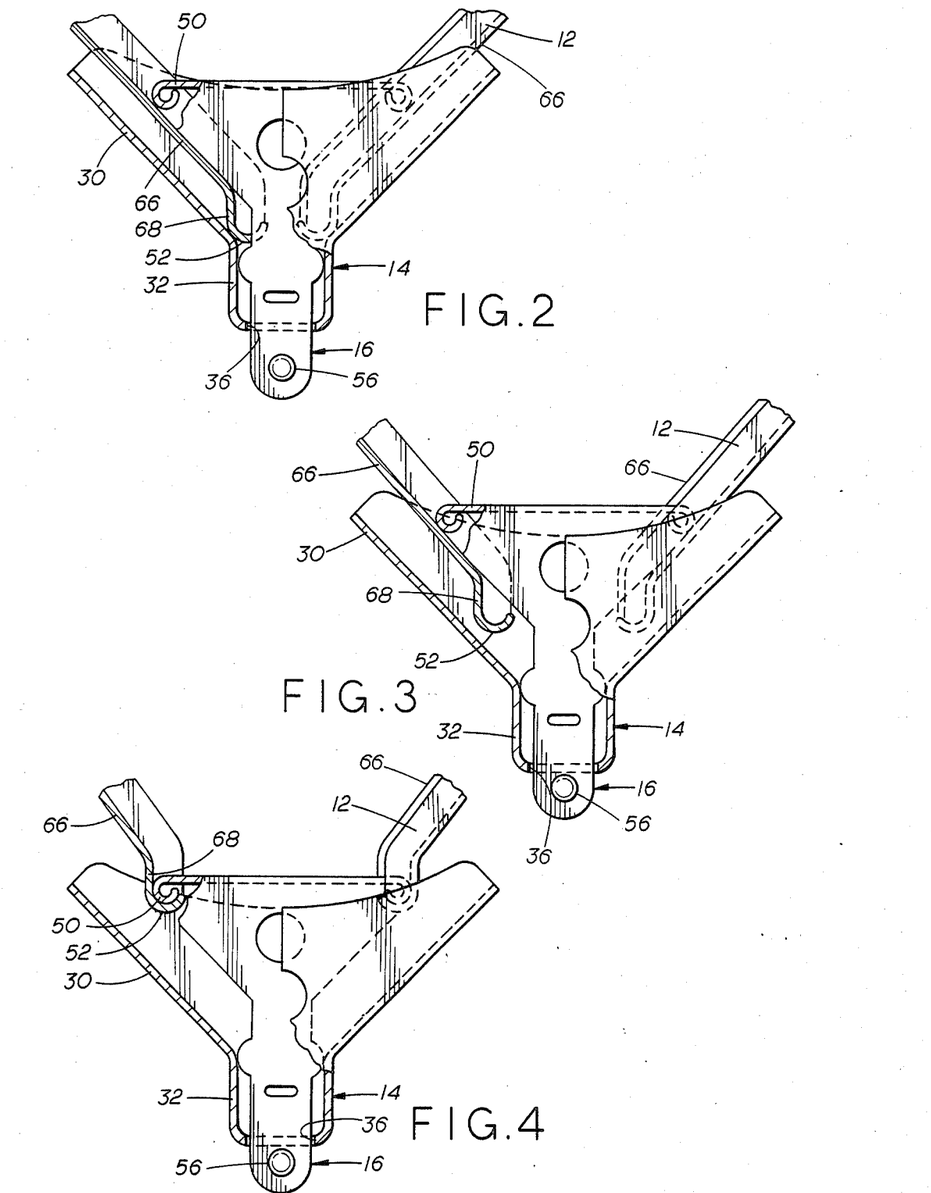
FIG. 2 is a partial view similar to FIG. 1, showing the housing as it has been pulled partially downwardly, and the beginning of the opening of the clamp ring.
FIG. 3 is a partial view similar to FIG. 1, showing the housing pulled even further down, and the wedging action of the spreader opening the clamp ring.
FIG. 4 is a partial further view, similar to FIG. 1, showing the ring in its wedged open position with the housing and spreader being pulled to their most downward position.

The opening and closing of the clamp ring 10 will now be explained with reference to FIGS. 1 through 5. To open the clamp ring 10 from the closed position, as shown in FIG. 1, the lock is, of course, first removed from the bolt holes 38 and 54 in the housing and spreader, respectively. The seal, if any, is removed from the slot, 58. Thereupon, the housing 14 is grasped and pulled straight down, relative to the ring 12, as shown in FIG. 2. This action causes the extensions 68 of the arms 66 to be pulled out of the throat 32 of the housing. In so doing, the arms 66 of the ring 12 engage the shoulders 50 of the spreader and lift the spreader 16 upwardly relative to the housing 14.

Referring to FIG. 3, which is the unstressed position of the ring 12, further downward movement of the housing 14 relative to the ring 12 causes the spreader 16 to move even further upwardly until its progress is stopped by the stop or rivet 56 engaging the bottom 34 of the throat 32 of the housing 14. Since the extensions 68 of the arms are no longer constrained by the throat 32 of the housing, they begin to move substantially apart. This is aided by the caming or wedging action of the shoulders 50 of the spreader 16 engaging the insides of the arms 66. The nature of the geometry of the design is such that, as the ring is spread apart, the housing moves down a corresponding amount such that the lugs 52 move to a wider portion of the mouth of the housing; this increases the clearance to compensate for the spreading of the ring lugs, and thus avoids interference with the housing.

Finally, as seen in FIG. 4, the shoulders 50 of the spreader 16 come into the radial extensions 68 of the arms 66 and engage the inwardly shaped lugs 52. The lugs prevent the ring from being pulled completely off of the spreader. This ends the downward movement of the housing, and also creates the widest opening apart of the arms 66 and therefore of the ring 12. Since the extensions 68 are basically parallel, the spreader, in the position shown in FIG. 4, with the shoulders engaging the lugs, is stable, and held open. The ring 12 may now be disengaged from the electric meter base 28 and the meter box flange 26.

To close the ring, one proceeds from the open position, shown in FIG. 4 to the canted or cocked position shown in FIG. 5. If one were to merely push up on the housing in an attempt to release the spreader, the housing would slide up relative to the ring and spreader, until the housing mouth contacted the lugs. Further force would only be transmitted to the lugs, and no force would tend to release the spreader. Referring now to FIG. 5, the housing 14 is cocked relative to the ring 12 so as to slide one shoulder 50 of the spreader 16 out of the extension 68 of the arm 66 and away from the lug 52. The opposite shoulder 50 remains engaged with its lug 52, as shown to the right of FIG. 5. Meanwhile the centralizer tabs 48 serve, in combination with the engagement of the stem 46 of the spreader with the elongate opening 36 in the bottom 34 of the housing, to keep the spreader legs 44 in line with the mouth 30 of the housing, i.e., to keep the spreader centered in line with the housing. This cocking action allows the arm 66 to slide or cam along the shoulder 50, and for the extension 68 to move inwardly into the mouth 30 of the housing. Thereafter, the housing is pushed upwardly relative to the ring, is straightened out, and the arms of the ring are forced back toward each other by the Y-shape of the housing until both of the extensions 68 have snapped into the throat 32 of the housing, as shown in FIG. 1. At this point, the ring is closed to its fullest extent, and the lock may be inserted into the bolt holes, which are now aligned. If the spreader is not aligned, it may be, by simply pulling on its stem 46.

Referring now to FIGS. 14-21, a slightly different embodiment of the clamp ring 10 is shown. In this version, the arms of the ring have an additional curve in them, and the spreader is folded back over in the back, so that the stop or rivet may be fastened to the body, rather than to the stem of the spreader. This positioning also allows the rivet and slot in conjunction with the spreader stem to act as a centralizer, since in this embodiment the stem does not extend through the housing when the ring is open.

Figures 14, 15, 16:
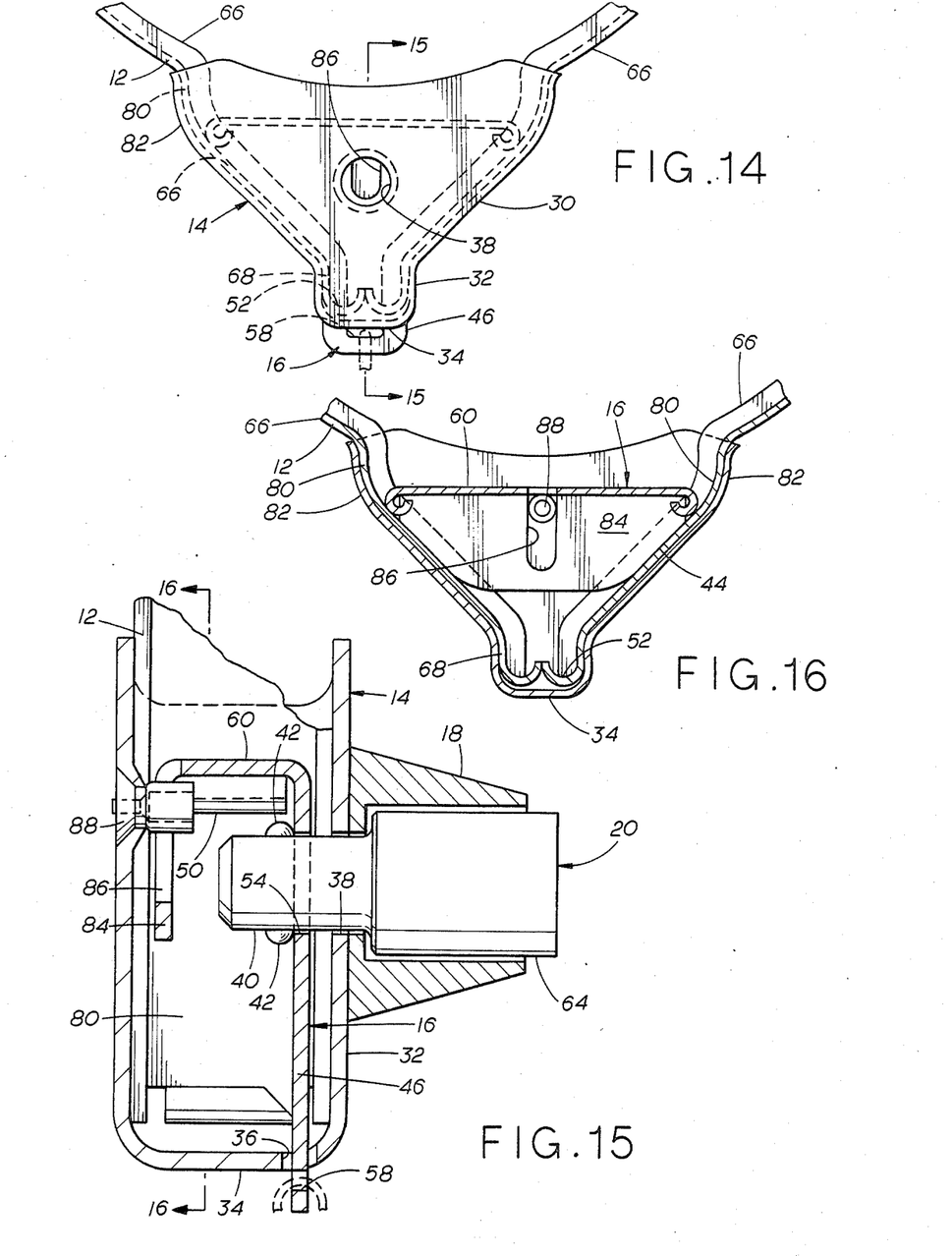
FIG. 14 is a front view, showing a second embodiment of the invention.
FIG. 15 is a side view, partially in section, taken along the line 15—15 of FIG. 14.
FIG. 16 is a partial sectional view, taken along the line 16—16 of FIG. 15.

As shown in FIG. 14, the split ring 12 includes two arms 66 which extend toward each other, and generally tangent to the remainder of the ring. However, before the tangent arm 66 is formed, the ring incorporates a generally radial portion 80. As before, the arm is terminated with a generally radial extension 68, with an inwardly shaped lug 52 at the end. The housing 14 is generally Y-shaped with a mouth 30 and a throat 32, as before. However, the extreme upper portion of the mouth bends inwardly, so as to approximate the radial portion 80 of the ring. The purpose of this radial portion 80 and the inward bend 82 of the housing 14 is to change the geometry of the housing adjacent to the ring when the clamp ring 10 is closed, and more particularly to make it even more difficult for a vandal to wedge a screwdriver, or other instrument, between the ring 12 and the housing 14, in the vicinity of the bend 82.

As before, the housing includes a bolt hole 38 in the face thereof. The spreader 16 extends beyond the bottom 34 of the housing 30, and, as before, includes a seal slot 58 in the stem 46 thereof.

Referring now to FIGS. 15, 17-19 and 20, the spreader 16 is more easily seen. As before, the legs 44 of the spreader are generally Y-shaped, to conform to the same shape of the housing 14. The stem 46 of the spreader is designed to pass through an elongate opening 36 in the bottom 34 of the housing. The spreader 16 is bent over at the top 60 and then downwardly in the back, much in the shape of an inverted "J". In the back 84 of the spreader 16 is formed a vertical slot 86. Corresponding to the slot, and set in the back of the housing is a stop or rivet 88 which is emplaced when the clamp ring is assembled. The rivet 88 acts to guide the spreader by means of the slot 86, in combination with the interaction of the stem 46 and the throat 32 of the housing. It also acts to limit both the upward and downward movement of the spreader 16, and to also prevent the spreader from cocking with respect to the housing 14. Thus, this combination of the rivet 88 and slot 86 serves to replace the centralizer tabs 48, the extended stem 46, and the rivet 56 shown in the prior embodiment.

Figure 17:
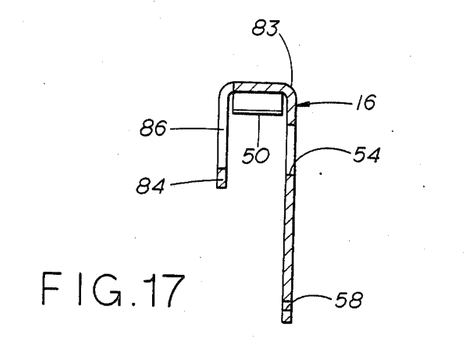
FIG. 17 is a sectional side view, taken along the line 17—17 of the FIG. 19.
Figure 18:
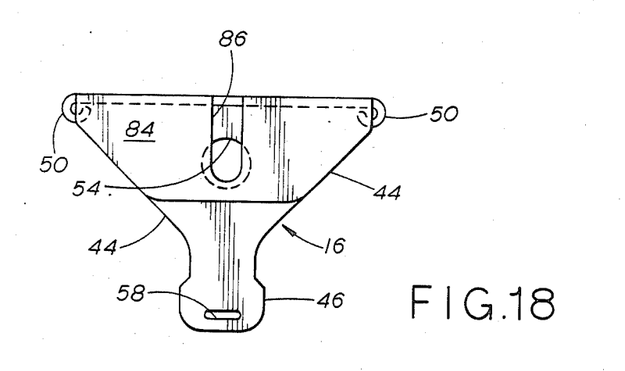
FIG. 18 is a back view of the spreader of the second embodiment.
Figure 19:
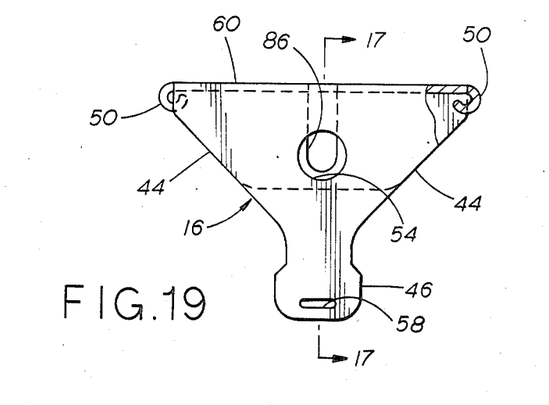
FIG. 19 is a front view, partially in section, of the spreader of the second embodiment.
Figure 20:
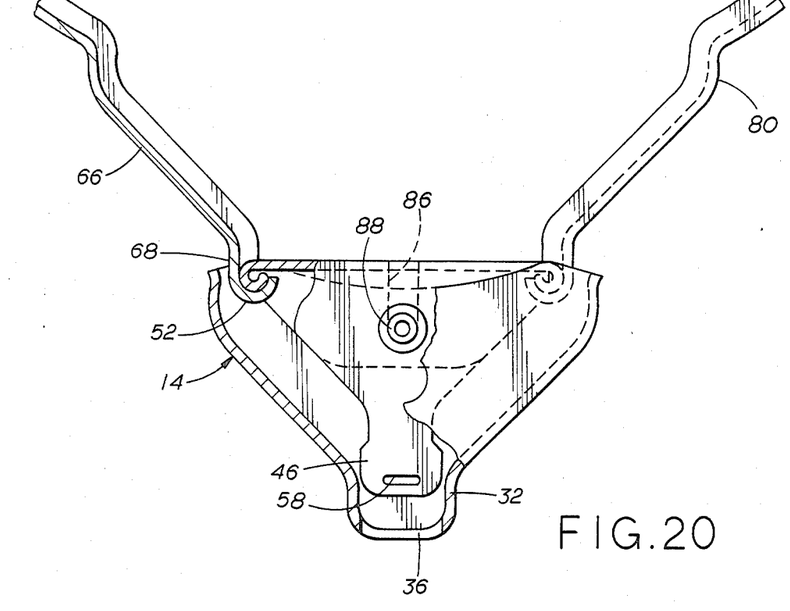
FIG. 20 is a partial sectional front view, similar to FIG. 14 except showing the clamp ring in an open position with the housing and spreader in their most downward positions.

As further seen in FIGS. 17-19 the outer ends of the legs 44 of the spreader terminate in shoulders 50. The front of the spreader 16 also incorporates a bolt hole 54 which aligns with the bolt hole 38 in the housing.

Referring to FIG. 15, the barrel lock 20 is shown inserted into the closed clamp ring 10, and more particularly, the bolt 40 extends through the bolt hole 38 in the housing and the bolt hole 54 in the spreader. Further, the retaining balls 42 are extended, thus preventing the removal of the bolt 40, which itself closely fits into the two bolt holes. Also illustrated in FIG. 15 is a lock guard 18 which surrounds the outer or key portion 64 of the barrel lock 20. The purpose of the lock guard is to shield the lock and to make it harder to grasp the lock and pull it out illicitly. To this end, the lock guard may be made tapered, as shown.

Figure 21:
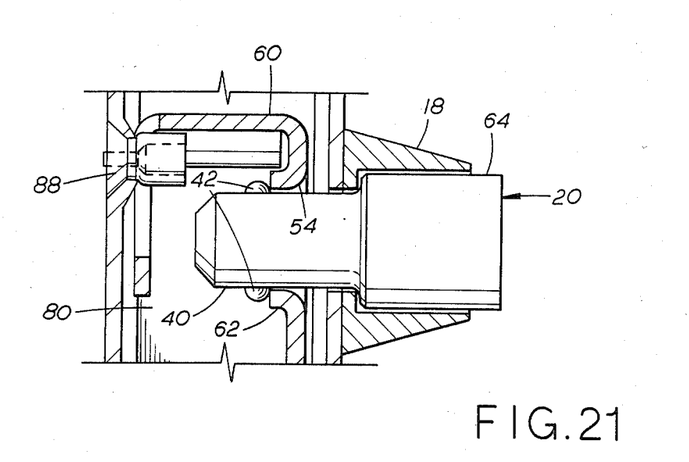
FIG. 21 is a sectional side view, similar to FIG. 15 and also taken along the line 15—15 of FIG. 14, showing the locked ring with a lock inserted, and showing a modified form of spreader with reinforcing ring.

A further modification of the spreader 16 is seen in FIG. 21. In this instance, the bolt hole 54 in the spreader is upset inwardly so as to form a reinforcement area 62, as in the prior embodiment. The reinforcement area 62 results in a somewhat stronger spreader. It also allows the use of a barrel lock 20 with a somewhat longer bolt distance between the retaining balls 42 and the key portion 64.

The operation of this second embodiment of the invention is virtually identical to the operation of the prior embodiment, and no further description thereof is felt necessary.

Thus, it is seen that the clamp ring of the present invention provides a unique and unitary clamp ring particularly useful in holding electric meter bases to meter housing flanges. However, in a similar manner, the clamp ring may be used to secure other types of devices together, and the scope of the invention is to be limited only by the claims. The present invention, therefore, is well adapted to carry out the objects and attain the ends and advantages mentioned, as well as others inherent therein. While the presently preferred embodiments have been given for the purpose of disclosure, numerous changes in the details of construction, and the combination, shape, size and arrangement of the parts and uses may be resorted to without departing from a spirit and scope of the invention.

What is claimed is:

1. In a meter clamp ring assembly for securing a meter to a flanged meter housing by means of a split ring, having a generally U-shaped cross-section, which surrounds the meter base and flange on the housing, the improvement comprising:
   (a) the ring having downwardly extending arms, generally tangent to the perimeter of the ring, and each arm ending in a radial extension, and an inwardly extending lug;
   (b) a generally Y-shaped housing, having a mouth to receive the ring arms and a throat to receive the extensions, and so arranged that the throat of the Y holds the ring extensions adjacent to one another when inserted therein, and the arms of the ring lie within the mouth and along the Y-shaped sides of the housing;

(c) a spreader, which has generally Y-shaped legs and a depending stem mounted within the housing, with the stem extending through the throat of the housing, and arranged to hold the ring arms against the sides of the mouth of the housing, when the extensions are in the throat; and (d) both the housing and the spreader having co-axial holes therethrough which are aligned for the insertion of a locking means when the ring arms are held against the sides of the mouth by the spreader legs.

2. The invention of claim 1 including a slot in the stem of the spreader, which slot is located below the housing when the ring arms are held against the sides of the mouth by the spreader legs, whereby an appropriate seal may be inserted in the slot.

3. The invention of claim 1 including centralizer tab means extending outwardly from the stem of the spreader and against the inside of the throat of the housing, to hold the spreader centrally in line with the housing.

4. The invention of claim 1 including a stop means in one of the housing and spreader and interacting with the other of the spreader and housing to prevent the removal of the spreader from the housing.

5. The invention of claim 1 including a reinforcing rim about the hole in the spreader.

6. A clamp ring for securing two circular flanged objects together by means of the flanges, including:

(a) a split ring having a generally U-shaped cross-section, said ring having a circular portion adapted to clamp the flanges therebetween;

(b) each end of the ring having a downwardly extending U-shaped cross-section arm, the arm being generally tangent to the circular portion of the ring;

(c) each arm having an extension, the extension being generally radial to the circular portion of the ring;

(d) each extension terminating in a lug, the lugs extending inwardly toward each other;

(e) a housing having a general Y-shaped front and back, the mouth of the housing being at the top with the sides of the housing tapering inwardly, and the throat of the housing being at the bottom with the sides being generally parallel, the bottom of the housing being closed, with an elongate opening therethrough, the housing shaped and sized to closely enclose the arms of the ring within the tapered sides and the extensions of the ring within the throat when the lugs are pulled together and the lugs are adjacent the bottom of the housing;

(f) a spreader having a general Y-shaped, with legs tapering inwardly to a stem which extends downwardly, the outer ends of the legs having shoulders arranged to engage the lugs of the ring when the lugs are against the shoulders, the spreader shaped and sized to fit within the arms and between the extensions when the extensions are within the throat and at the bottom of the housing;

(g) the housing having a bolt hole through its face above the throat;

(h) the spreader having a bolt hole between its legs; and (i) both of the bolt holes being co-axial and aligned when the extensions of the ring are within the throat and at the bottom of the housing and the legs of the spreader are against the arms of the ring.

7. The invention of claim 6 including:

(a) the stem of the spreader extending through the elongate opening in the bottom of the housing when the extensions of the arms are at the bottom of the housing; and (b) the stem having a slot therein just beyond the bottom of the housing, whereby a seal may be inserted in the slot.

8. The invention of claim 6 including:

(a) means maintaining the spreader central within the housing when moved upwardly relative thereto; and (b) means preventing complete removal of the spreader from the inside of the housing.

9. The invention of claim 6 including:

(a) the ring including a generally radial portion between the circular portion of the ring and each arm, and (b) the mouth of the housing extending upwardly to enclose the radial portion of the ring when the lugs are adjacent the bottom of the housing.

10. The invention of claim 1 including:

(a) a lock guard mounted on and extending from the housing, and having a generally cylindrical bore therein to enclose a locking means inserted therein.

11. The invention of claim 6 including:

(a) a lock guard mounted on and extending from the housing, co-axial with the bolt hole, and having a generally cylindrical bore therein to enclose a locking means inserted therein.

* * * * *